United States Patent
Zhou et al.

(10) Patent No.: US 8,572,524 B2
(45) Date of Patent: Oct. 29, 2013

(54) STATISTICAL OPTICAL PROXIMITY CORRECTION

(75) Inventors: Wenzhan Zhou, Singapore (SG); Liang Choo Hsia, Singapore (SG); Meisheng Zhou, Singapore (SG); Zheng Zou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 862 days.

(21) Appl. No.: 11/943,591

(22) Filed: Nov. 21, 2007

(65) Prior Publication Data

US 2009/0132992 A1 May 21, 2009

(51) Int. Cl.
*G06F 17/50* (2006.01)

(52) U.S. Cl.
USPC .................................. 716/55; 716/53; 703/14

(58) Field of Classification Search
USPC ...................................................... 714/55, 53
See application file for complete search history.

(56) References Cited

U.S. PATENT DOCUMENTS

| | | | |
|---|---|---|---|
| 5,965,309 A | 10/1999 | Ausschnitt et al. | |
| 6,578,190 B2 | 6/2003 | Ferguson et al. | |
| 6,803,995 B2 | 10/2004 | Ausschnitt | |
| 6,869,739 B1 | 3/2005 | Ausschnitt et al. | |
| 7,042,551 B2 | 5/2006 | Ausschnitt | |
| 7,245,356 B2 * | 7/2007 | Hansen | 355/67 |
| 7,403,265 B2 * | 7/2008 | Tinnemans et al. | 355/67 |
| 7,617,477 B2 * | 11/2009 | Ye et al. | 716/56 |
| 8,102,408 B2 * | 1/2012 | Verma et al. | 346/87 |
| 2006/0161452 A1 * | 7/2006 | Hess | 705/1 |

OTHER PUBLICATIONS

Wenzhan Zhou et al., Say "Good-bye" to DOF: Statistical Process Window Analysis with Inline Lithographic Process Variations, Proc. of SPIE, Metrology, Inspection, and Process Control for Microlithography XXI, Apr. 5, 2007, pp. 651832, vol. 6518.
C.P. Ausschnitt et al., Process Window Metrology, Proc. of SPIE, Metrology, Inspection, and Process Control for Microlithography XIV, Mar. 2000, pp. 158-166, vol. 3998.
Brad Eichelberger et al., Simultaneous Dose and Focus Monitoring on Product Wafers, Proc. of SPIE, Metrology, Inspection, and Process Control for Microlithography XVII, 2003, pp. 247-254, vol. 5038.
C.P. Ausschnitt et al., Modeling for Profile-Based Process-Window Metrology, Proc. of SPIE, Data Analysis and Modeling for Process Control, 2004, pp. 38-47, vol. 5378.
Wenzhan Zhou et al., Advanced Lithography Parameters Extraction by Using Scatterometry System, Proc. of SPIE, Metrology, Inspection, and Process Control for Microlithography XXI, 2007, pp. 651823, vol. 6518.

* cited by examiner

*Primary Examiner* — Thuan Do
(74) *Attorney, Agent, or Firm* — Horizon IP Pte. Ltd.

(57) ABSTRACT

An optical proximity correction (OPC) model incorporates inline process variation data. OPC is performed by adjusting an input mask pattern with a mask bias derived from the OPC model to correct errors in the input mask pattern.

19 Claims, 10 Drawing Sheets

STATISTICAL OPTICAL PROXIMITY CORRECTION

FIELD OF THE INVENTION

The present invention relates generally to fabrication of integrated circuits (ICs), and more particularly to optical proximity correction (OPC) models for improving feature generation of ICs.

BACKGROUND OF THE INVENTION

Photolithographic techniques are used to form various IC structures on a wafer. In photolithography, desired circuit layouts on photomasks are optically transferred onto wafers through masking, exposure and development processes. Unfortunately, optical proximity effects, along with mask pattern fidelity and photoresist processing limitations commonly lead to a mismatch between the desired pattern and the actual result on the wafer.

To improve image fidelity, resolution enhancement techniques (RET) such as optical proximity correction (OPC) models have been introduced. The object of OPC is to make systematic modifications to mask geometry to compensate for systematic and stable errors. However, as technology progresses to smaller ground rules, traditional OPC techniques models are becoming less effective. Manufacturing yield can be negatively impacted as a result.

From the foregoing discussion, it is desirable to provide effective OPC systems and techniques.

SUMMARY OF THE INVENTION

The present invention relates to IC fabrication and to forming features in an IC. In one embodiment, a method for forming an IC comprises the step of providing a substrate with a photoresist layer. The photoresist layer is exposed by passing radiation from an exposure source through a mask comprising a pattern adjusted with a mask bias derived from an optical proximity correction (OPC) model incorporating inline process variation data. The photoresist is developed to transfer the pattern on the mask to the photoresist layer.

In another aspect of the invention, a method for forming a mask comprises the step of providing an input mask pattern. OPC using an OPC model incorporating inline process variation data is performed, wherein the step of performing OPC comprises adjusting the input mask pattern with a mask bias derived from the OPC model to correct errors in the input mask pattern.

In yet another aspect of the invention, an OPC system is disclosed. The OPC system comprises an OPC simulator. The OPC simulator includes an OPC model incorporating inline process variation data. When an input mask pattern is provided to the OPC system, the OPC model applies a mask bias to adjust the input mask pattern to correct errors in the input mask pattern.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to IC fabrication. More particularly, the present invention relates to forming features in an IC. In one embodiment, the invention relates to an OPC system. The OPC system is used to create mask patterns used in forming features in the IC.

The fabrication of ICs involves the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. Such techniques generally use an exposure source to project an image from a mask onto a mask layer on the surface of the substrate. Depending on the stage of processing, the substrate can be a bare substrate or include one or more device layers. The mask layer, for example, comprises photoresist. An antireflective coating (ARC) can be provided underneath the resist layer. The exposure source illuminates the resist layer, exposing it with the desired pattern. The resist is then developed to expose portions of the underlying layer, which are removed by etching while unexposed portions are protected by the resist and remain intact, creating the desired features on the substrate.

Figure 1:
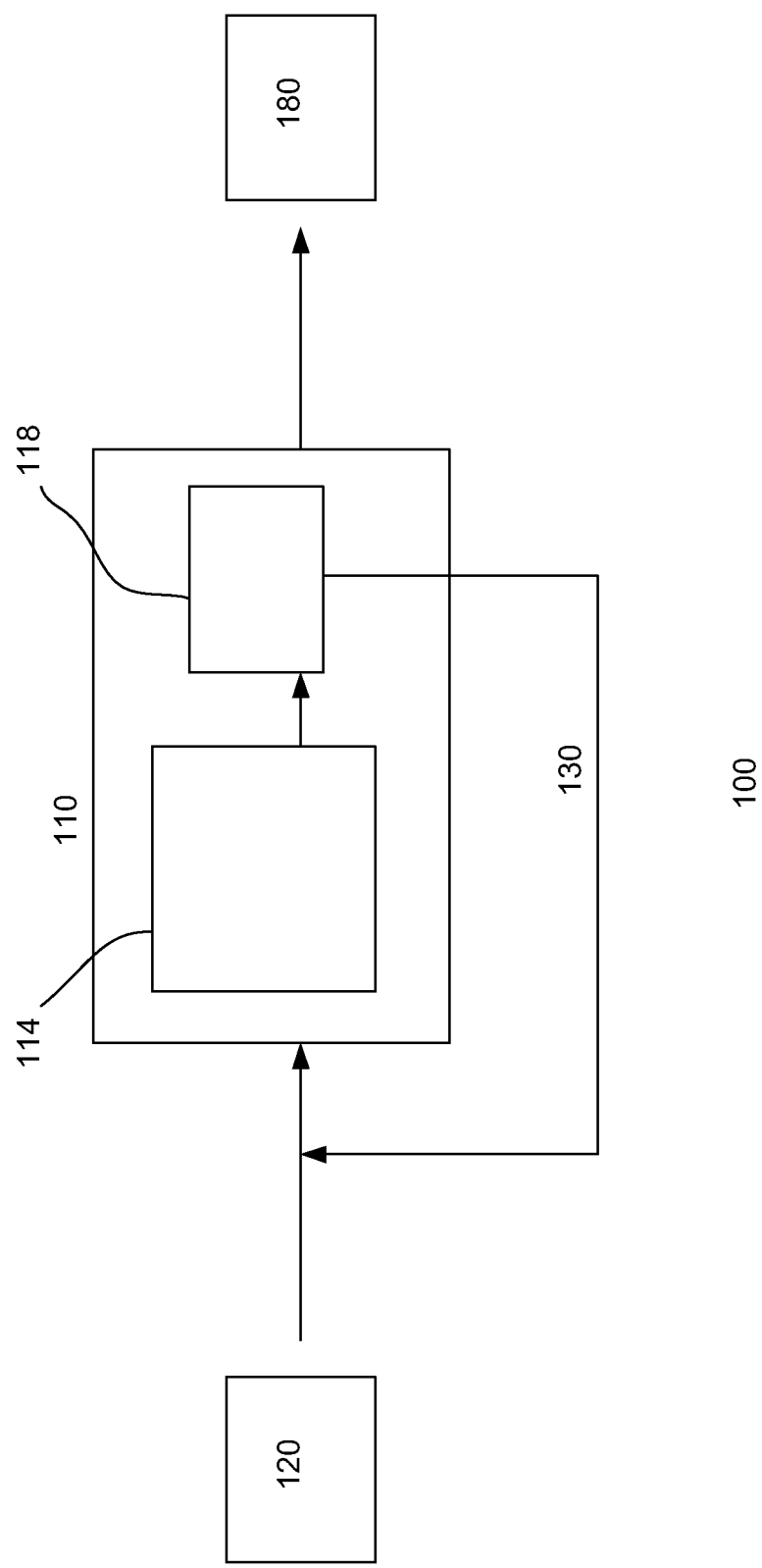
FIG. 1 shows an OPC system in accordance with one embodiment of the invention.

FIG. 1 shows an OPC system 100 in accordance with one embodiment of the invention. The OPC system comprises, for example, a program stored on a storage device. The program can be installed in a computer system for execution. The OPC system as shown in FIG. 1 comprises an OPC simulator 110 which includes a statistical OPC model 114 and a critical dimension (CD) verification module 118. The statistical OPC model, in accordance with one embodiment of the invention, is built from inline process variation data of an actual process line. The inline process data is used to estimate the CD variation of one or more feature types on a mask. The feature types can comprise, for example, line features or hole features. Other feature types are also useful. In one embodiment, the statistical OPC model calculates an overall CD yield (or Cpk) based on the estimated CD variation of the different feature types. In one embodiment, the statistical OPC model takes into account process windows of the feature types in computing the overall Cpk.

An input mask (IM) 120 containing a mask pattern under investigation is input to the OPC system. The mask pattern, for example, corresponds to actual features to be formed on a substrate of an IC. The statistical OPC model analyzes the IM and applies a mask bias to modify the IM. The mask bias corrects for errors in the IM to create a modified IM. An overall Cpk of the modified IM is estimated. The overall Cpk is analyzed by the CD verification module to determine if any errors exist. The correction and verification process is iterative based on a feedback loop 130, continuing until all errors are corrected to produce a final mask (FM) 180. Preferably, the correction and verification process is iterative, continuing to fine tune the mask bias to produce maximum CD yield. In accordance with one embodiment of the invention, Cpk is used as the verification or optimization parameter. By using Cpk as the optimization criteria, OPC accuracy can be improved.

Figure 2:
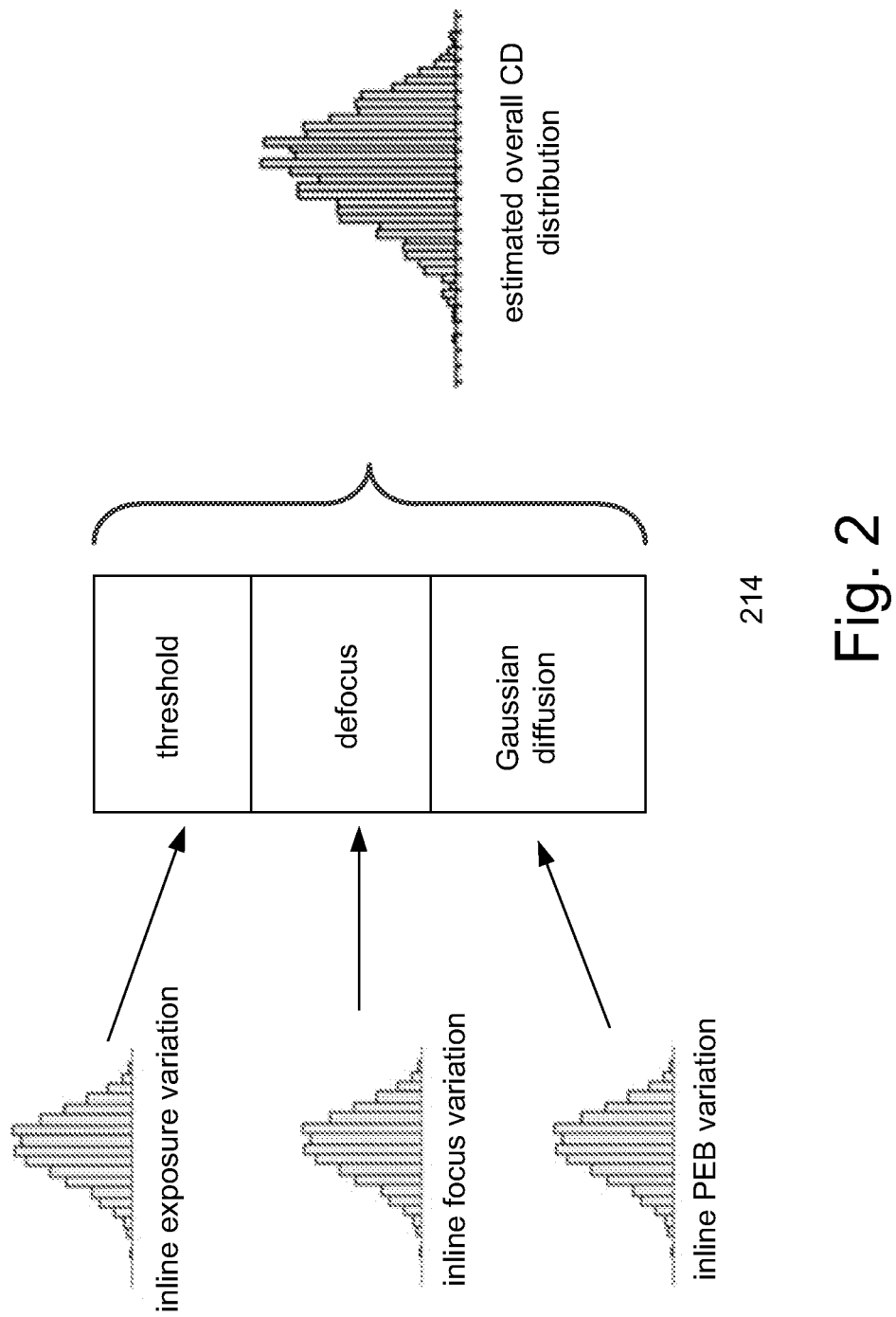
FIG. 2 shows a statistical OPC model in accordance with one embodiment of the invention.

FIG. 2 shows a statistical OPC model 214 in accordance with one embodiment of the invention. As previously described, the statistical OPC model is built from inline process variation data, wherein the inline process data is used to estimate CD variation of one or more feature types on a mask. The present invention can also be applied to conventional types of OPC techniques by modifying them to be based on inline variation data. In one embodiment, inline process variations include variations in process parameters such as exposure, focus, and post exposure bake (PEB) temperature. Variations in other parameters which can potentially influence image fidelity can also be included. Such parameters include, for example, etch bias, coma aberration and spherical lens aberration. The statistical OPC model can determine CD dependency on the process parameters included in the model. For example, CD dependency on exposure dose, focus and PEB temperature, respectively, can be determined. This information can be used to determine the process window of each feature type. In one embodiment, the process windows are taken into account during optimization.

The inline variation data can be used to estimate systemic and/or random CD variation, including, for example, lot to lot variations, wafer to wafer variations, field to field variations or across chip linewidth variations (ACLV). Other sources of CD variation are also useful. In one embodiment, the estimated CD variation represents variation in develop inspection CD (DICD).

In a preferred embodiment, CD data includes DICD as well as resist sidewall angle measurements. Providing CD data which includes only DICD is also useful. However, use of both DICD and sidewall angle measurements provides more accurate CD prediction since both of these parameters impact the final inspection CD (FICD). In one embodiment, the statistical OPC model can be extended to the entire design for manufacturing (DFM) field.

As shown, histograms of inline exposure variations, inline focus variations and inline PEB variations are contained in the statistical OPC model. With inline exposure, focus and PEB variations, threshold, defocus, Gaussian diffusion distributions can be developed to estimate an overall CD distribution based on Cpk.

In one embodiment, CD variation data derived from the inline process variation data is used to identify, for each feature type, failure-sensitive weak points in the wafer. This information can be taken into consideration during OPC optimization to reduce failures in these locations. In such case, optical rule checking (ORC) is performed as part of the OPC process, and a separate post-OPC ORC step is unnecessary. This advantageously increases the turn-around from initial wafer design to wafer manufacture.

Figure 3:
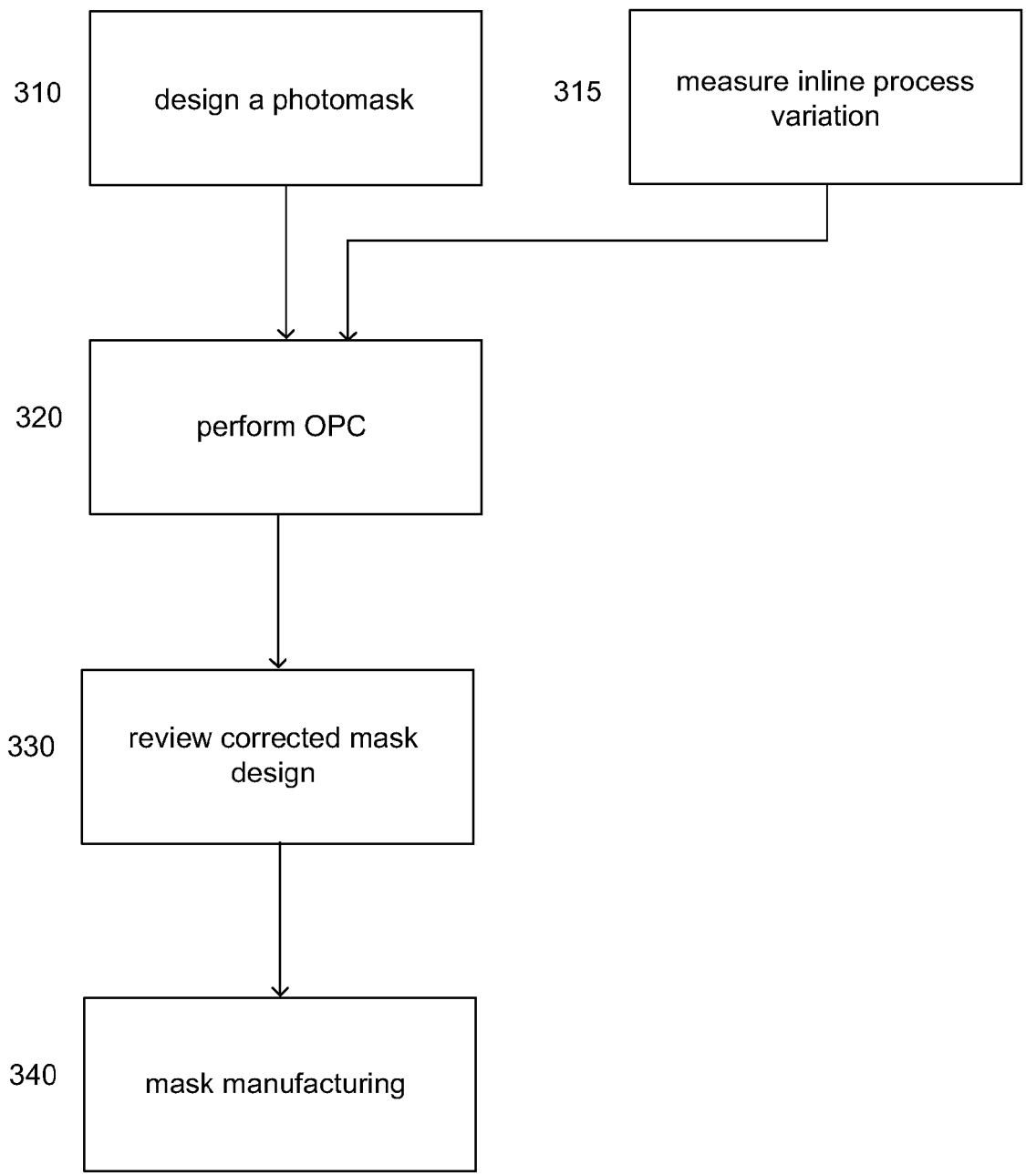
FIG. 3 shows a process for mask design in accordance with one embodiment of the invention.

FIG. 3 shows a process 300 for mask design which incorporates the OPC model in accordance with one embodiment of the invention. The process begins with photomask design at step 310. At step 315, inline variation of key photolithographic process parameters is measured. Inline process variation can be measured using an optical CD mark. The optical CD mark may be incorporated on either production wafers or test wafers. In order to compensate for anticipated distortions introduced by the optical system, and by photoresist and etching processes during wafer fabrication, OPC is performed at step 320. In one embodiment, the statistical OPC model described in connection with FIGS. 1 and 2 is used. Inline process variation data derived in step 315 is inputted into the OPC model. In one embodiment, inline variation in exposure dose, focus and PEB temperature are inputted into the OPC model. Inline process variation data is used to estimate CD variation, and thereby to compute the CD Cpk, of different feature types. Optimization is then performed with minimization of CD Cpk as an optimization criteria to determine the optimal mask bias condition. At step 330, the corrected mask design may be subjected to a final review by optical lithographers prior to mask manufacturing at step 340.

Figure 4A:
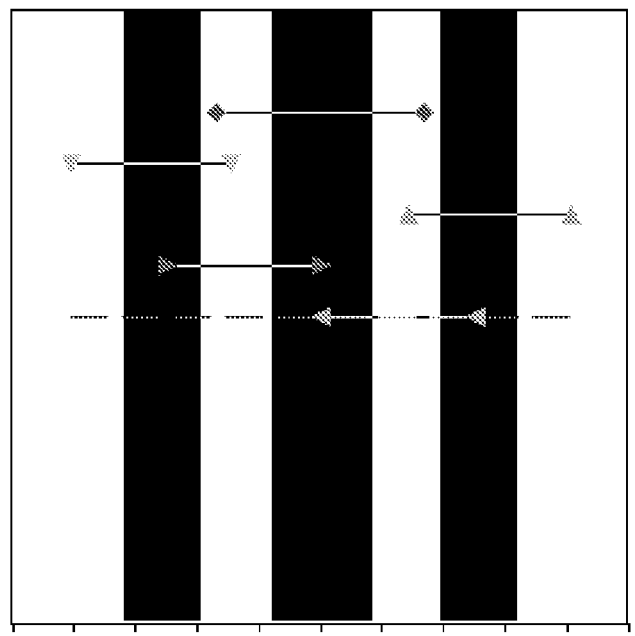
FIGS. 4a-b show an exemplary optical CD mark in accordance with one embodiment of the invention.
Figure 4B:
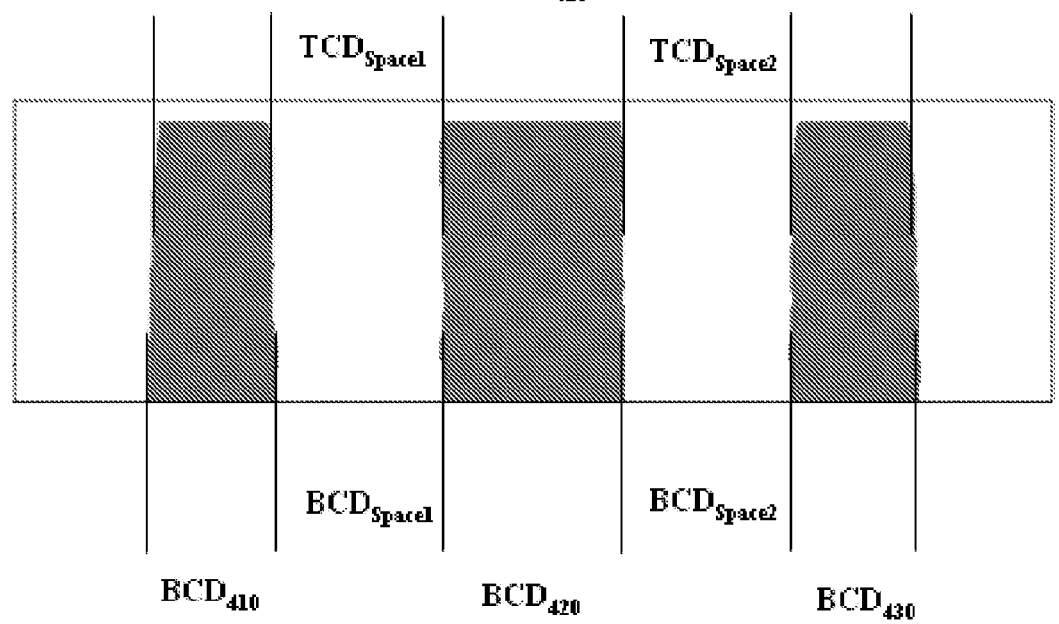

FIGS. 4a-b illustrate an exemplary optical CD mark, in accordance with one embodiment of the invention. FIGS. 4a and 4b show top and cross-sectional views of the mark, respectively. Referring to FIG. 4a, the CD mark consists of three lines of photoresist 410, 420 and 430. Other numbers of lines of photoresist, or other patterns, may also be useful. As shown, line 420 has a different CD as compared with lines 410 and 430, which have the same CD. The CD of lines 410, 420 and 430 can be any useful value depending on the semiconductor process generation.

Referring to FIG. 4b, the profile of the photoresist lines after development is shown. Photoresist profile is known to be highly correlated to exposure dose, focus, and other process parameters. As such, variations in profile are a good indication of process variations and measurements of photoresist dimensions can thus be used to detect process variation with high accuracy. Profile measurements can be made using conventional techniques, for example, spectroscopic ellipsometry (SE). Other methods such as atomic force microscopy (AFM) are also useful.

Figure 5:
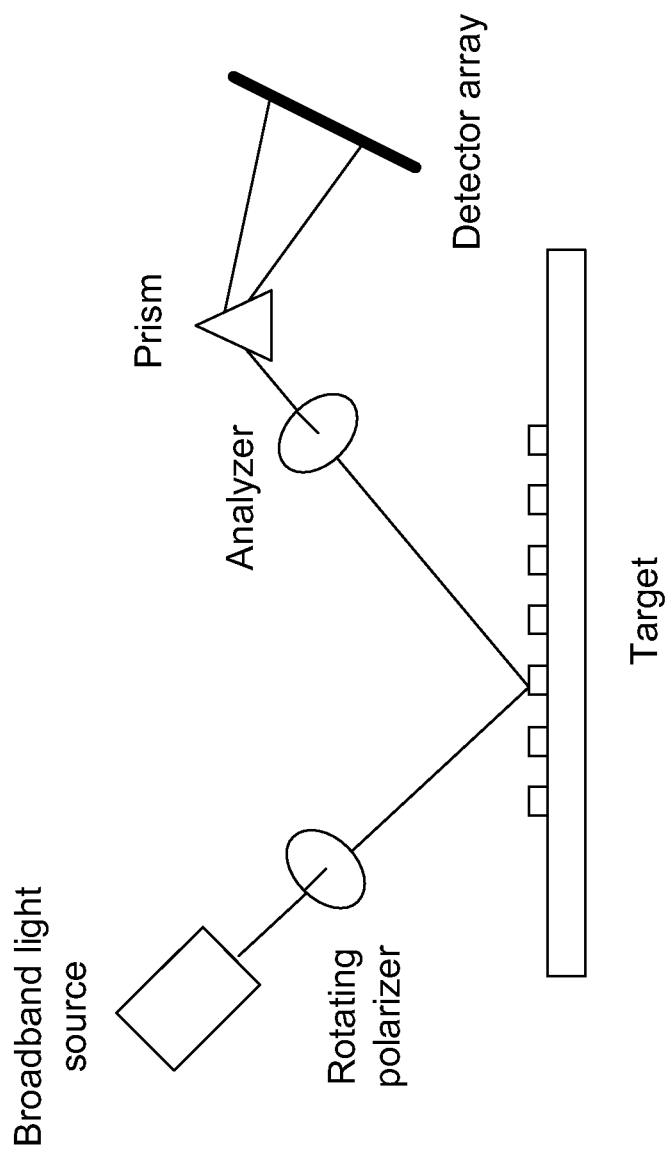
FIG. 5 shows a metrology system for taking profile measurements of features on a wafer using scatterometry.

FIG. 5 shows a metrology system for taking profile measurements of features on a wafer using scatterometry. Scatterometry makes use of optical signals produced by reflectrometry or ellipsometry techniques. Measurements are taken off a target which is typically a grating structure consisting of a symmetrical line/space array. The interaction of light reflection, diffraction, and reflection striking the target influences the phase and intensity of a signal reflected off the target. Signal information can be used with computational modeling techniques such as Rigorous Coupled Wave Analysis (RCWA) to reconstruct the profile shape of the patterned feature.

Up to 10 photoresist profile measurements can be extracted from the optical CD mark illustrated in FIG. 4b. These include the top-side CD of line 410 ($TCD_{410}$), bottom-side CD of line 410 ($BCD_{410}$), top-side CD of line 420 ($TCD_{420}$), bottom-side CD of line 420 ($BCD_{420}$), top-side CD of line 430 ($TCD_{430}$), bottom-side CD of line 430 ($BCD_{430}$), top-side CD of the space between lines 410 and 420 ($TCD_{Space1}$), bottom-side CD of the space between lines 410 and 420 ($BCD_{Space1}$), top-side CD of the space between lines 420 and 430 ($TCD_{Space2}$), and bottom-side CD of the space between lines 420 and 430 ($BCD_{Space2}$). Computational techniques can then be applied to derive process variation data from these measurements. For example, four profile measurements, namely, $TCD_{410}$, $BCD_{410}$, $TCD_{420}$ and $BCD_{420}$ can be used to predict variations in exposure dose and focus.

Figure 6A:
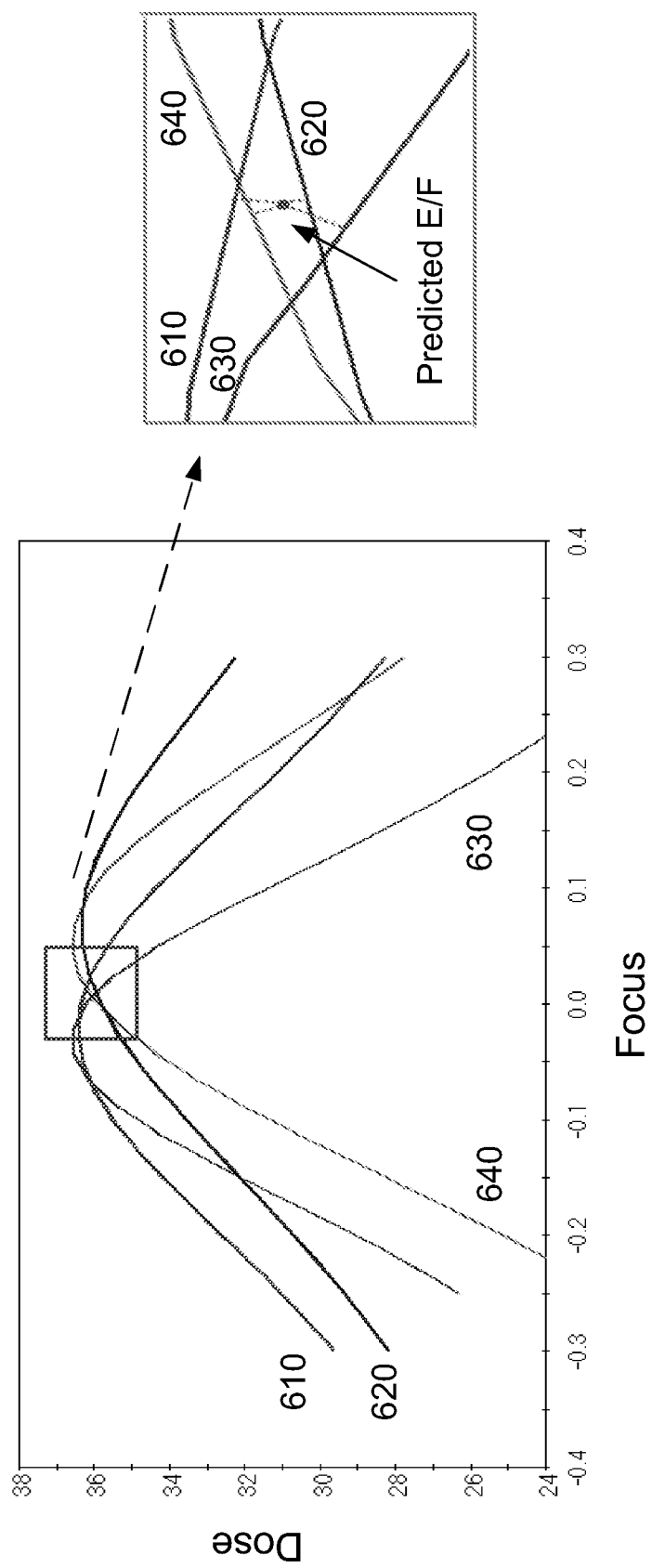
FIG. 6a shows Bossung plots of exposure dose against focus with linewidth as a response.
Figure 6B:
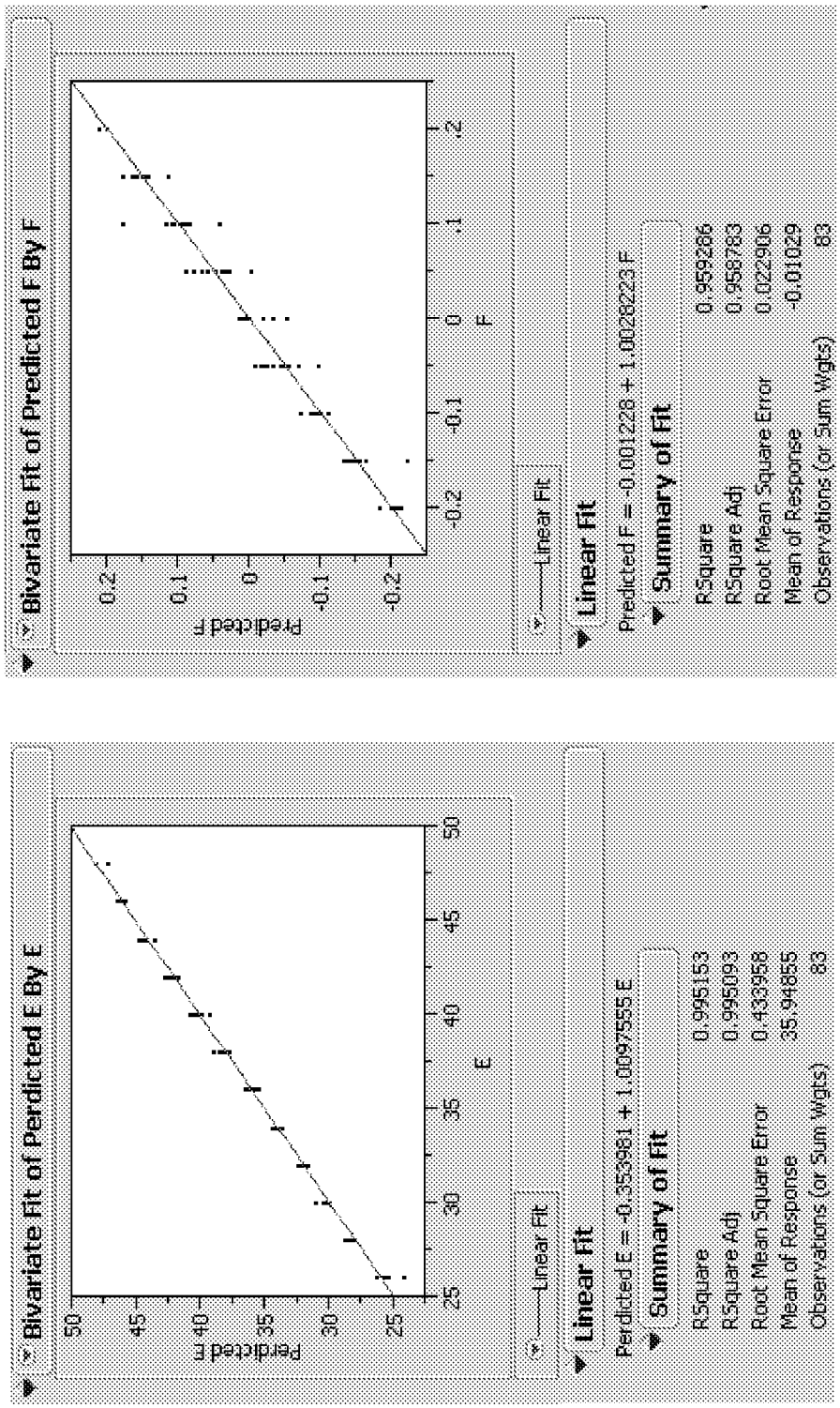
FIG. 6b shows the correlation between predicted and actual exposure dose/focus (E/F) values.

FIG. 6a shows Bossung plots illustrating the effect of focus and exposure dose on photoresist profile. Exposure dose is plotted against focus, using linewidth as a response. The lines 610, 620, 630 and 640 represent Bossung plots corresponding to $TCD_{410}$, $BCD_{410}$, $TCD_{420}$ and $BCD_{420}$, respectively. As shown, the plots can be used to predict exposure dose and focus (E/F) conditions during processing. This is determined by the intersection point of the 4 lines, as shown in the exploded view diagram. Referring to FIG. 6b, using this method, good correlation (R-squared>0.95) can be obtained between predicted and actual E/F values. The optical CD mark thus allows detection of process variation with high accuracy and low noise.

Figure 7A:
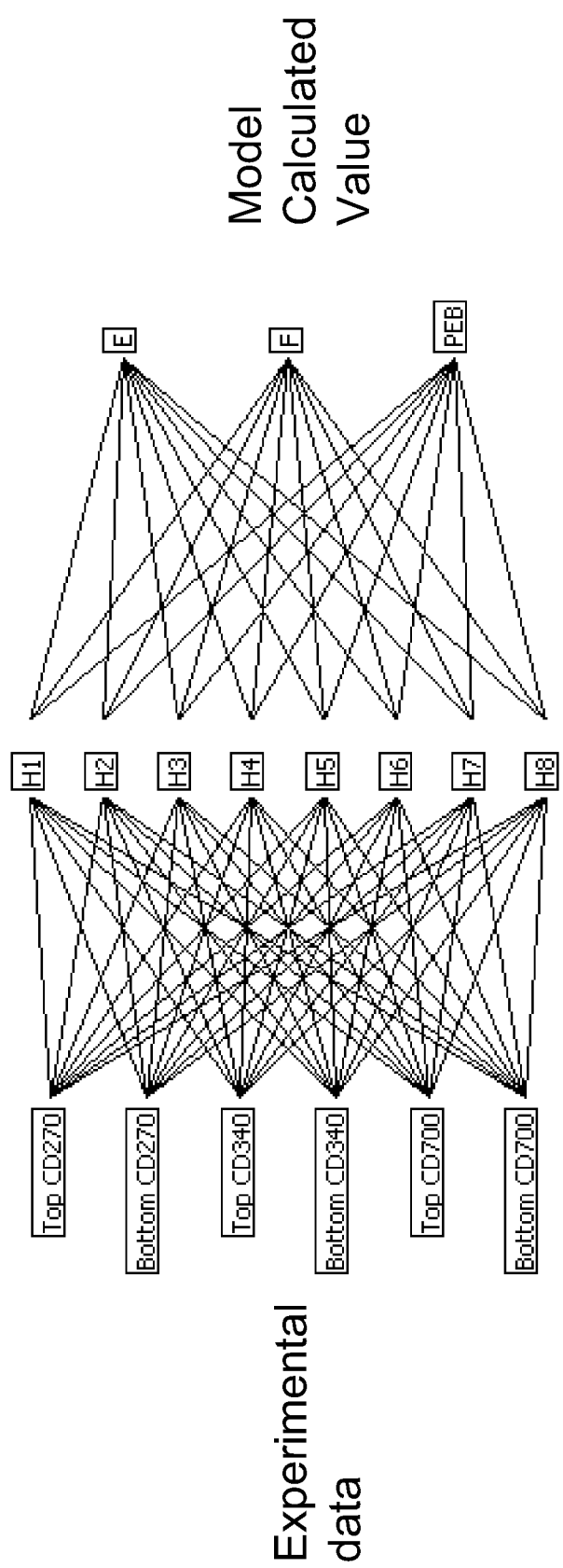
FIG. 7a shows a computational model for calculating predicted variations in exposure dose, focus and PEB temperature.
Figure 7B:
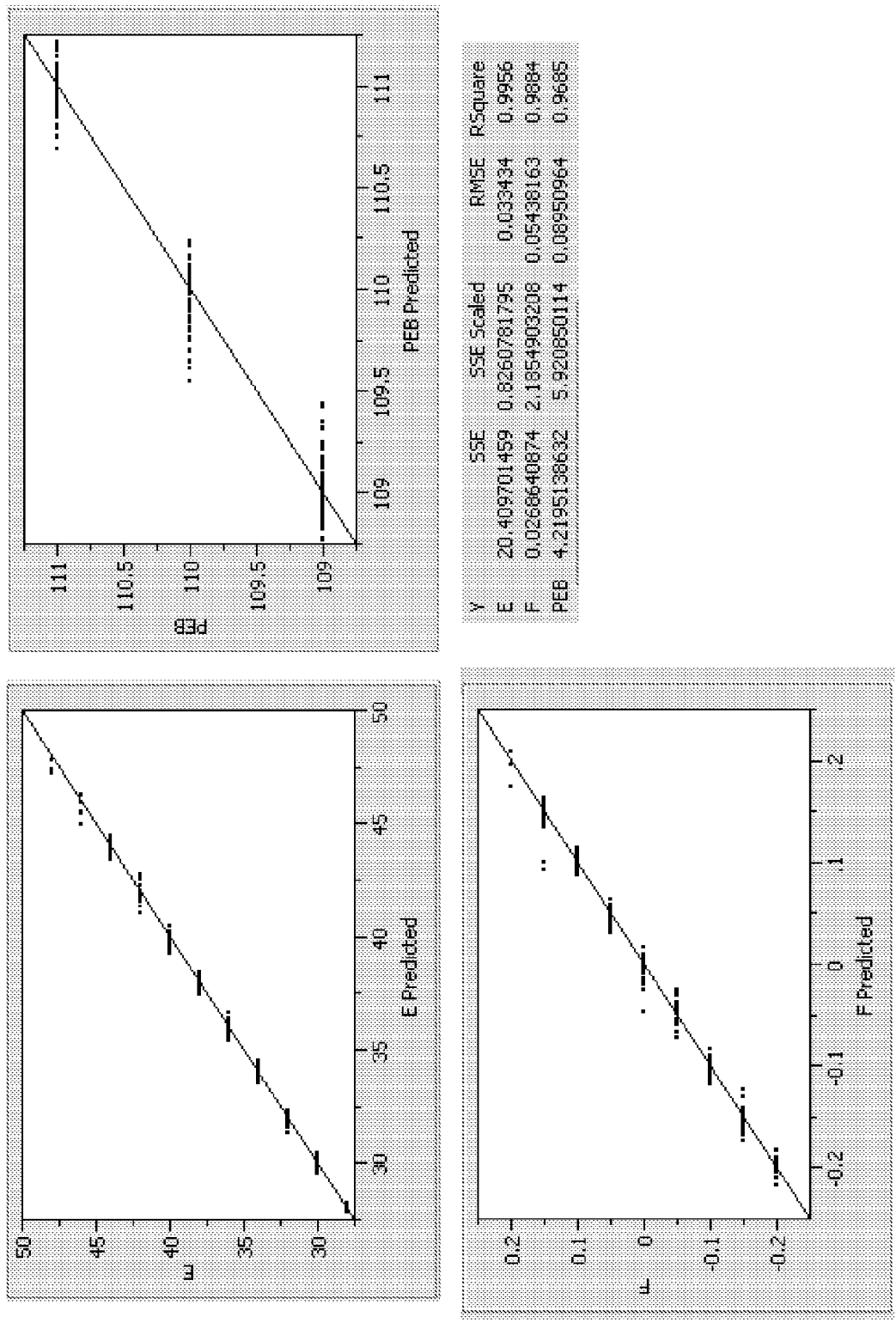
FIG. 7b shows the difference between predicted and actual variations in exposure dose, focus and PEB temperature.

In one embodiment, six profile measurements, namely, $TCD_{410}$, $BCD_{410}$, $TCD_{420}$, $BCD_{420}$, $TCD_{430}$, and $BCD_{430}$ are used to predict variations in exposure dose, focus and PEB temperature. The measurement values can be inputted into a computational model, shown in FIG. 7a, to calculate the predicted variation values. Correlation between predicted and actual values is shown in FIG. 7b. Once again, good correlation with R-squared values>0.95 is demonstrated. In other embodiments, variation of up to five process parameters including, for example, exposure dose, focus, PEB diffusion, coma aberration and spherical aberration, can be derived from the profile measurements.

Figure 8B:
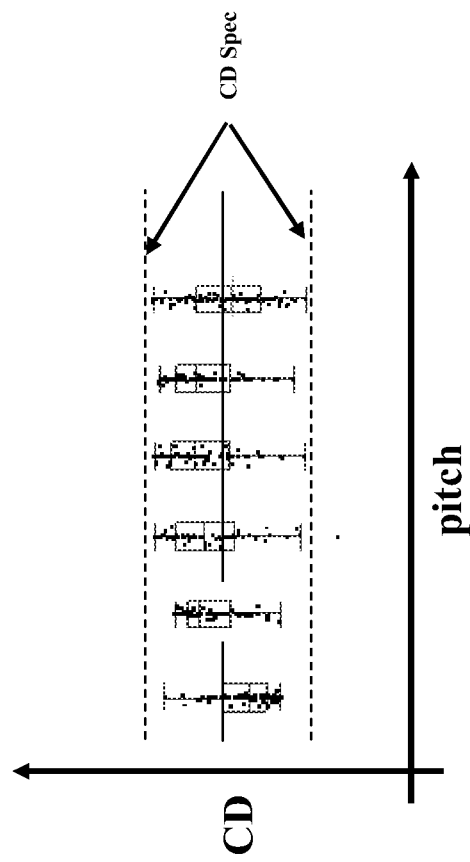
FIGS. 8a and 8b, respectively, show the OPC performance of the OPC model of the present invention and a traditional OPC model based on "best" dose and focus.
Figure 8A:

FIGS. 8a and 8b show the comparison of OPC performance between the OPC model of the present invention and a traditional OPC model based on "best" dose and focus, and achieving the CD target as the optimization target. For each model, the data set comprises CD measurements taken off 10 lots, wherein 5 wafers/lot, 20 fields/wafer and 4 points/field are measured. Referring to FIG. 8b, the OPC model according to the present invention, wherein optimization is based on minimizing CD Cpk, results in more data points falling within the CD specification, as defined by upper and lower CD limits. In contrast, as shown in FIG. 8a, conventional OPC models based on target CD, while ensuring the CD at the "best" process condition is on target, produces more out-of-specification data points, and thereby a lower Cpk.

The optical CD mark can be used to estimate both systemic and random CD variations. Additionally, wafer geography and processing order dependent components of the variation, such as, from lot-to-lot, wafer-to-wafer, field-to-field, as well as across-chip-linewidth-variation (ACLW) can be distinguished. Accordingly, locations at which the maximum CD aberration of each feature type is encountered can be determined. This information can be used to identify, for each feature type, locations within the wafer or the lot where CD is liable to fall outside of allowable limits. These locations are identified as "weak" points which are associated with a higher probability of failure at wafer test or probe test. These weak points may be determined by performing a design rule check (DRC) on the IC layout, and can be further classified into focus-sensitive, PEB-sensitive or lens aberration-sensitive weak points.

In one embodiment, the OPC model according to the invention takes into account failure-sensitive weak points in determining the optimal mask pattern. As described, the OPC model performs optimization with minimizing CD Cpk of individual feature types as optimization targets. In the present embodiment, additional CD Cpk values, of each feature type at its respective weak points, are estimated by the model. The Cpk values so computed reflect the process window of each feature type because the CD limits used to calculate Cpk represent the allowable variation within which failure is avoided. These Cpk values are used as additional optimization criteria in the OPC model. For example, optimization can be performed to ensure the Cpk values are within pre-determined specifications, for example, Cpk>1.33. Optimization can also be performed to minimize the Cpk.

The embodiment described incorporates ORC into the OPC process, obviating the need for an independent ORC step. As compared with the traditional ORC process, wherein optical lithographers manually adapt the corrected mask design for mask manufacturing, the OPC model according to one embodiment of the invention can automatically make the appropriate adjustments.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming an IC comprising:
providing a substrate with a photoresist layer;
providing a mask with a mask pattern, wherein providing the mask comprises
deriving the mask pattern from an input mask design layout which is provided prior to forming a physical mask,
obtaining a mask bias from an optical proximity correction (OPC) model of an OPC system with an OPC simulator, wherein the OPC system estimates critical dimension (CD) variation of one or more feature types on the input mask from measured inline process variation data of an actual wafer process line to obtain the mask bias, wherein inline process variation data includes variations in develop inspection CD and resist sidewall angle measurements profile, and
adjusting the input mask with the mask bias to produce an adjusted input mask, and
forming the physical mask having a physical mask pattern using the adjusted input mask;
exposing the photoresist layer by passing radiation from an exposure source through the physical mask formed using the adjusted input mask; and
developing the photoresist to transfer the physical mask pattern of the physical mask to the photoresist layer.

2. The method of claim 1 wherein the OPC model determines CD dependency of the one or more feature types on variations in one or more process parameters.

3. The method of claim 2 wherein the one or more process parameters comprise exposure dose, focus or post exposure bake (PEB) temperature, or a combination thereof.

4. A method for forming a mask comprising the steps of:
providing an input mask design layout which is used to form a physical mask prior to forming the physical mask;
performing optical proximity correction (OPC) of the input mask design layout using an OPC model with an OPC simulator, wherein the OPC model incorporates measured inline process variation data of an actual wafer process line to obtain a mask bias, wherein inline process variation data includes variations in develop inspection CD and resist sidewall angle measurements profile; and forming the physical mask using the mask design layout biased with the measured inline process variation data.

5. The method of claim 4 wherein the OPC model estimates critical dimension (CD) variation of one or more feature types on the input mask from the inline process variation data.

6. The method of claim 5 wherein the OPC model determines CD dependency of the one or more feature types on variations in one or more process parameters.

7. The method of claim 6 wherein the one or more process parameters comprise exposure dose, focus or post exposure bake (PEB) temperature, or a combination thereof.

8. The method of claim 6 wherein the OPC model determines process windows of the one or more feature types based on the inline process variation data and estimated CD variation.

9. The method of claim 8 wherein the steps of providing an input mask pattern and correcting errors in the input mask pattern are iteratively repeated until all the errors in the input mask pattern are corrected, the process windows are taken into account during iteration.

10. The method of claim 9 wherein the OPC model identifies failure-sensitive weak points on the input mask pattern, the failure-sensitive weak points are taken into account during iteration.

11. The method of claim 4 wherein the steps of providing an input mask pattern and correcting errors in the input mask pattern are iteratively repeated until all the errors in the input mask pattern are corrected.

12. An optical proximity correction (OPC) system comprising:

an OPC simulator comprising an OPC model which incorporates measured inline process variation data of an actual wafer process line, wherein inline process variation data includes variations in develop inspection CD and resist sidewall angle measurements profile;

wherein the OPC simulator determines a mask bias based on the OPC model; and when an input mask design layout is provided to the OPC system prior to forming a physical mask, the OPC system applies the mask bias to adjust the input mask design layout to correct errors in the input mask design layout to produce an output mask pattern, the output mask pattern is used to form the physical mask.

13. The OPC system of claim 12 wherein the OPC model estimates critical dimension (CD) variation of one or more feature types on the input mask from the inline process variation data, and calculates an overall critical dimension (CD) yield (Cpk) based on an estimated CD variation.

14. The OPC system of claim 13 wherein the OPC simulator further comprises a critical dimension (CD) verification module, the CD verification module analyzes the overall Cpk to determine if any errors exist.

15. The OPC system of claim 14 wherein the OPC system performs iteration based on a feedback loop until all the errors in the input mask pattern are corrected.

16. The OPC system of claim 15 wherein maximizing the overall Cpk is used as an optimization criteria during iteration.

17. The OPC system of claim 13 wherein the OPC system performs iteration based on a feedback loop until all the errors in the input mask pattern are corrected.

18. The OPC system of claim 17 wherein maximizing the overall Cpk is used as an optimization criteria during iteration.

19. The OPC system of claim 12 wherein the OPC system performs iteration based on a feedback loop until all the errors in the input mask pattern are corrected.

* * * * *